US012660525B2

(12) United States Patent
Hoshino et al.

(10) Patent No.: US 12,660,525 B2
(45) Date of Patent: Jun. 16, 2026

(54) APPARATUS AND METHODS FOR PROCESSING BONDING SEMICONDUCTOR WAFERS

(71) Applicant: Tokyo Electron Limited, Tokyo (JP)

(72) Inventors: Satohiko Hoshino, Albany, NY (US); Scott Lefevre, Albany, NY (US); Yuji Mimura, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 713 days.

(21) Appl. No.: 18/078,302

(22) Filed: Dec. 9, 2022

(65) Prior Publication Data

US 2024/0194478 A1     Jun. 13, 2024

(51) Int. Cl.
*H10P 14/60*          (2026.01)
*H10P 10/00*          (2026.01)
*H10P 72/00*          (2026.01)

(52) U.S. Cl.
CPC ........ *H10P 14/6319* (2026.01); *H10P 10/128* (2026.01); *H10P 72/0402* (2026.01)

(58) Field of Classification Search
CPC ............. H01L 21/02252; H01L 21/187; H01L 21/67017; H01L 21/2007; H01L 21/02002; H10P 14/6319; H10P 10/128; H10P 72/0402; H10P 90/1914; H10P 90/00
See application file for complete search history.

(56) References Cited

U.S. PATENT DOCUMENTS

| | | | | |
|---|---|---|---|---|
| 6,831,018 B2 * | 12/2004 | Kanegae | ........... | H01L 21/31138 |
| | | | | 257/E21.252 |
| 6,994,769 B2 * | 2/2006 | Singh | .................. | C23C 16/4405 |
| | | | | 156/345.35 |
| 7,964,511 B2 * | 6/2011 | Tahara | .................... | G03F 7/427 |
| | | | | 438/712 |
| 9,024,376 B2 | 5/2015 | Masuoka et al. | | |
| 9,425,324 B2 | 8/2016 | Diaz et al. | | |
| 9,478,624 B2 | 10/2016 | Colinge et al. | | |
| 10,121,898 B2 * | 11/2018 | Sugawara | ............ | H10D 62/402 |

* cited by examiner

*Primary Examiner* — Eduardo A Rodela
(74) *Attorney, Agent, or Firm* — Foley & Lardner LLP

(57)          ABSTRACT
A method for manufacturing semiconductor devices. The method includes placing a semiconductor wafer in a chamber. The method includes applying, in the chamber, a plasma that contains no fluorine. The plasma causes one or more components, in contact with the chamber, that each comprise a fluorinated coating to release its fluorine on a surface of the semiconductor wafer.

18 Claims, 8 Drawing Sheets

100

110   PROVIDE SEMICONDUCTOR WAFER HAVING TO-BE BONDED SURFACE

120   FLUORINATE ONE OR MORE COMPONENTS OF CHAMBER

130   APPLY FLUORINE-FREE PLASMA IN THE CHAMBER

140   INCORPORATE FLUORINE INTO THE TO-BE BONDED SURFACE

310

320

300

APPARATUS AND METHODS FOR PROCESSING BONDING SEMICONDUCTOR WAFERS

FIELD OF THE DISCLOSURE

This disclosure relates to semiconductor devices and methods of bonding a plural number of semiconductor devices.

BACKGROUND

Typically, in a semiconductor device, various electronic components (e.g., transistors, diodes, resistors, capacitors, and the like) are formed on a semiconductor wafer. These semiconductor wafers (or one or more their respective device dies) may then be bonded to each other to form functional devices. These semiconductor wafers (or device dies) may be bonded together (e.g., stacked on top of one another) using any of various bonding techniques to form a functional device.

SUMMARY

At least one aspect of the present disclosure is directed to a method for manufacturing semiconductor devices. The method includes placing a semiconductor wafer in a chamber. The method includes applying, in the chamber, a plasma that contains no fluorine. The plasma causes one or more components, in contact with the chamber, that each comprise a fluorinated coating to release its fluorine on a surface of the semiconductor wafer.

In some embodiments, the one or more components fully surround an inner surface of the chamber.

In some embodiments, the one or more components partially surround an inner surface of the chamber.

In some embodiments, the one or more components are engageable with respect to the chamber.

In some embodiments, the plasma includes one or more insert gasses. In some embodiments, the plasma includes oxygen.

In some embodiments, the one or more components are each fluorinated prior to placing the semiconductor wafer in the chamber.

In some embodiments, the method further includes placing a second semiconductor wafer in the chamber. The method includes applying, in the chamber, the plasma to cause the one or more components to release its fluorine on a surface of the second semiconductor wafer. The method includes bonding the semiconductor wafer to the second semiconductor wafer, with their respective surfaces facing each other. The surfaces of the semiconductor wafer and the second semiconductor wafer each include respective top surfaces of a metal material and a dielectric material.

In some embodiments, prior to placing the semiconductor wafer in the chamber, the method further includes placing a dummy wafer in the chamber, wherein the dummy wafer includes a fluorinated coating; and applying, in the chamber, the plasma cause the dummy wafer to release its fluorine on a surface the one or more components At least another aspect of the present disclosure is directed to a method for fabricating semiconductor devices. The method includes placing a first semiconductor wafer in a chamber. The method includes applying, in the chamber, a plasma that contains no fluorine to cause one or more components, in contact with the chamber, that each comprise a fluorinated coating to release its fluorine on a first surface of the first semiconductor wafer. The method includes placing a second semiconductor wafer in the chamber. The method includes applying, in the chamber, the plasma to cause the one or more components to again release its fluorine on a second surface of the second semiconductor wafer.

In some embodiments, the method further includes bonding the first semiconductor wafer to the second semiconductor wafer, with the first surface and the second surface facing each other.

In some embodiments, each of the first surface and the second surface includes respective top surfaces of a metal material and a dielectric material.

In some embodiments, the one or more components fully surround an inner surface of the chamber.

In some embodiments, the one or more components partially surround an inner surface of the chamber.

In some embodiments, the one or more components are engageable with respect to the chamber.

In some embodiments, the plasma includes one or more insert gasses.

In some embodiments, the plasma includes oxygen.

Yet another aspect of the present disclosure is directed to an apparatus for processing semiconductor devices. The apparatus includes a chamber configured to house a semiconductor wafer to be bonded. The chamber comprises one or more components, in contact with the chamber, that each comprise a fluorinated coating. The chamber is further configured to house a plasma containing no fluorine.

In some embodiments, the plasma is configured to release fluorine from the fluorinated coating, with the released fluorine deposited on a surface of the semiconductor wafer.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustrations and a further understanding of the various aspects and implementations, and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Figure 1:
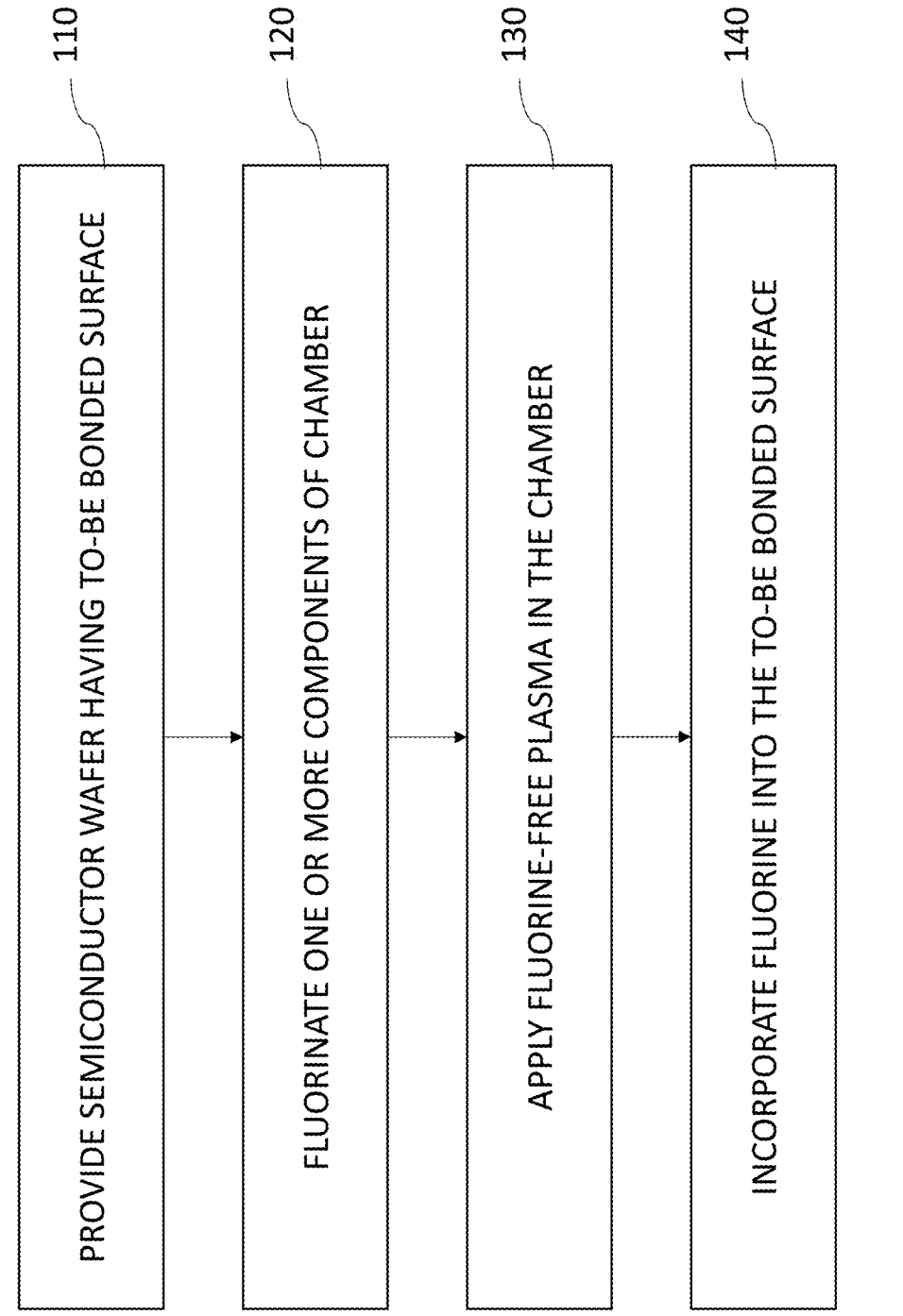
FIG. 1 shows a flowchart of a method for treating a bonding surface of a semiconductor device, according to an embodiment.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

There can be a variety of challenges to implementing stacked device dies or wafers. When bonding stacked wafers (dies) using, for example, a direct bonding or hybrid bonding technique, the respective surfaces of the wafers are usually desirable to be flat, smooth, and clean. For instance, the surfaces are cleaned (e.g., by standard RCA or concentrated $HNO_3$ or $H_2SO_4$:$H_2O_2$ solutions) to form silanol groups. When the wafers are brought into contact (followed by an annealing process), a polymerization reaction can take place between the silanol groups to from siloxane bonds. To further increase bonding strength between the wafers, it has been proposed to incorporate fluorine into the to-be bonded surfaces (hereinafter "bonding surfaces"). However, in existing technologies, such fluorine is typically introduced to the wafers as a process gas, which can disadvantageously damage on the surface of equipment that is configured to bond the wafers. Accordingly, the existing technologies for bonding wafer (or dies) have not been entirely satisfactory in some aspects.

The present disclosure provides various embodiments of an apparatus that houses a semiconductor wafer (or device die) and allows a bonding surface of the semiconductor wafer to be fluorinated while being immune from the above-identified issues, and a method of operating the apparatus. For example, the apparatus, as disclosed herein, includes one or more components that each contain a fluorinated coating. In some embodiments, such components may have been placed in a chamber of the apparatus, prior to loading a to-be bonded semiconductor wafer. Following loading the semiconductor wafer, a fluorine-free plasma can be applied in the chamber. Even containing no fluorine, the plasma can release fluorine from the fluorine-containing components, which causes such fluorine (e.g., in the form of fluorine radicals) to be incorporated into the bonding surface. As such, the to-be surfaces of the semiconductor wafers can be "treated" with fluorine. Such a gasless fluorine-incorporation technique can advantageously enhance bonding energy of the surface of a semiconductor wafer, while leaving the apparatus and/or corresponding equipment free from damage caused by fluorine gasses.

Reference will now be made to the figures, which for the convenience of visualizing the fabrication techniques described herein, illustrate a variety of materials undergoing a process flow in various views. Unless expressly indicated otherwise, each Figure represents one (or a set) of fabrication steps in a process flow for manufacturing the devices described herein. In the various views of the Figures, connections between conductive layers or materials may or may not be shown. However, it should be understood that connections between various layers, masks, or materials may be implemented in any configuration to create electric or electronic circuits. When such connections are shown, it should be understood that such connections are merely illustrative and are intended to show a capability for providing such connections, and should not be considered limiting to the scope of the claims.

Likewise, although the Figures and aspects of the disclosure may show or describe devices herein as having a particular shape, it should be understood that such shapes are merely illustrative and should not be considered limiting to the scope of the techniques described herein. For example, the techniques described herein may be implemented in any shape or geometry for any material or layer to achieve desired results. In addition, examples in which two transistors or devices are shown stacked on top of one another are shown for illustrative purposes only, and for the purposes of simplicity. Indeed, the techniques described herein may provide for one to any number of stacked devices. Further, although the devices fabricated using these techniques are shown as transistors, it should be understood that any type of electric electronic device may be manufactured using such techniques, including but not limited to transistors, variable resistors, resistors, and capacitors.

FIG. 1 illustrates a flowchart of an example method 100 for treating the bonding surface of a semiconductor device (e.g., a semiconductor wafer, a device die, etc.) using a gasless fluorine-incorporation technique. It is noted that the method 100 is merely an example, and is not intended to limit the present disclosure. Accordingly, it is understood that additional operations may be provided before, during, and after the method 100 of FIG. 1, and that some other operations may only be briefly described herein.

In brief overview, the method 100 starts with operation 110 in which a semiconductor wafer having a bonding surface is provided. The method 100 proceeds to operation 120 in which one or more components of a chamber are fluorinated. Next, the semiconductor wafer is loaded to a chamber configured to further process the semiconductor wafer for being bonded to one or more other semiconductor wafers. In some embodiments, such components of the chamber may have been fluorinated prior to loading the semiconductor wafer. The 100 then proceeds to operation 130 in which at least a fluorine-free plasma is applied in the chamber. The method 100 proceeds to operation 140 in which fluorine (e.g., from the one or more fluorinated components) is incorporated into the bonding surface of the semiconductor wafer.

In some embodiments, following the similar operations of the method 100, fluorine can be effectively incorporated into the bonding surface of one or more other semiconductor wafers that are configured to be bonded to each other. By treating the respective bonding surfaces of the semiconductor wafers using the disclosed techniques, bonding energy between the bonding surfaces can be significantly increased, while leaving the corresponding equipment almost free from being damaged by gaseous fluorine. In various embodiments, the "treated" semiconductor wafers can be bonded to each other through various bonding techniques such as, for example, a direct dielectric bonding (sometimes referred to as direct fusion bonding) technique, a BenzoCycloButene (BCB) polymer adhesive bonding technique, a non-adhesive technique, or a hybrid bonding technique. In the hybrid bonding technique, a permanent bond combines a dielectric bond (e.g., $SiO_x$) with one or more embedded metal (e.g., Cu) bonds to form interconnections. Hybrid bonding extends fusion bonding with embedded metal pads in the bond interface, which allows face-to-face connection of different semiconductor wafers.

Figure 2:
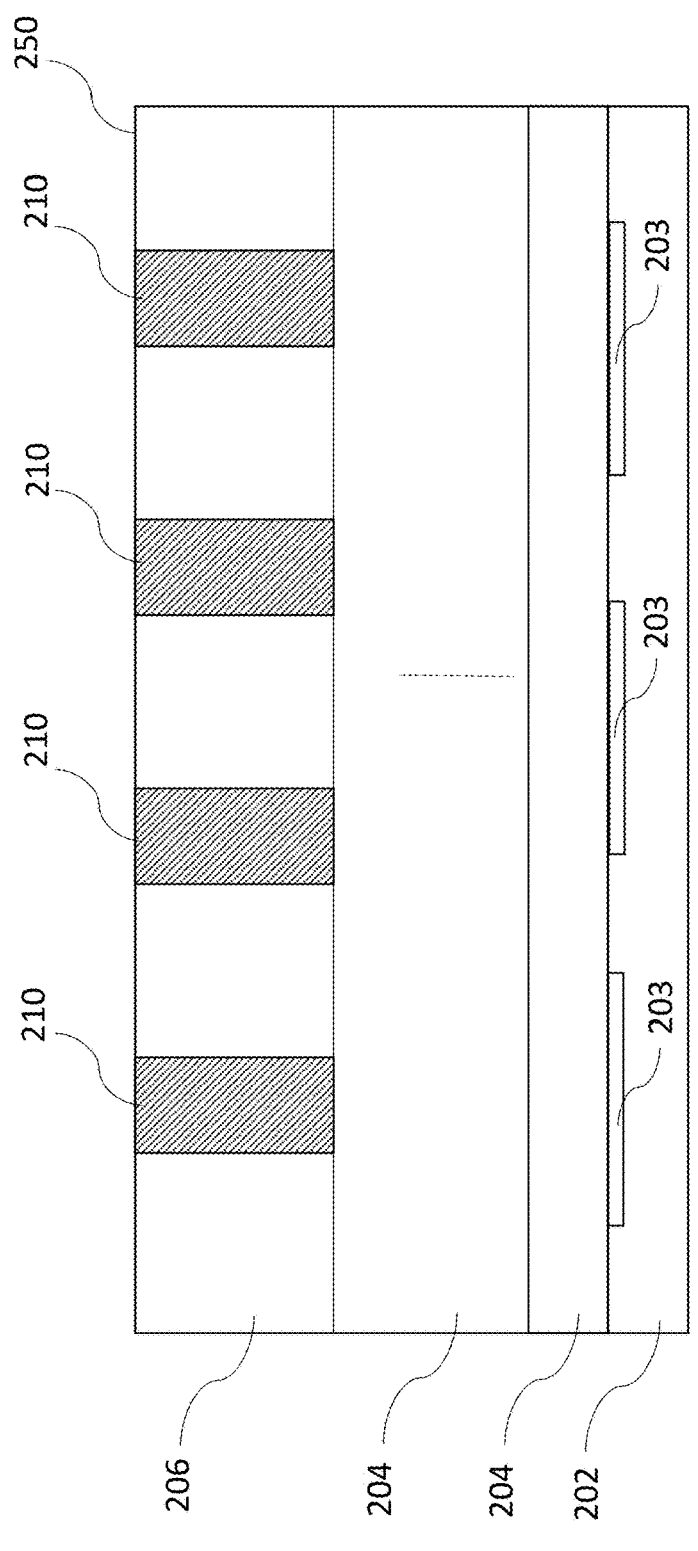
FIG. 2 shows a cross-sectional view of a semiconductor wafer, according to an embodiment.

Corresponding to operation 110 of FIG. 1, FIG. 2 is a cross-sectional view of an example first semiconductor wafer 200 to which the method 100 can be applied, in accordance with various embodiments.

As shown, the first semiconductor wafer 200 includes a first bonding surface 250, which includes both at least one dielectric material and at least one metal material. In various embodiments, the first bonding surface 250 (e.g., at least the portions with the dielectric material) can be treated (e.g., fluorinated) by the method 100. Specifically, the first semiconductor wafer 200 includes a first substrate 202, a number of first metallization layers 204 over the first substrate 202, a first surface dielectric layer 206 over a topmost one of the first metallization layers, and a number of first interconnect structures 210 embedded in the first surface dielectric layer 206. As such, the bonding surface 250 can be formed by hybrid of the first interconnect structures 210 and the first surface dielectric layer 206.

The first substrate 202 may be a semiconductor substrate, such as a bulk semiconductor, a semiconductor-on-insulator (SOI) substrate, or the like, which may be doped (e.g., with a p-type or an n-type dopant) or undoped. The first substrate 202 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the first substrate 202 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The first substrate 202 includes a number of device features/structures 203 (e.g., transistors, diodes, resistors, etc., which are not shown for the sake of clarity) formed along a (e.g., frontside) surface of the first substrate 202 and a number of interconnect structures (e.g., metal lines, metal vias, etc., which are not shown for the sake of clarity) formed over the device structures. The interconnect structures are configured to electrically connect the device structures to one another so as to form an integrated circuit, which can function as a logic device, a memory device, an input/output device, or the like. These interconnect structures (e.g., formed of conductive materials, such as Cu, Al, W, Ti, TiN, Ta, TaN, or multiple layers or combinations thereof) may be embedded in one or more dielectric layers (e.g., formed of low-k dielectric materials, such as $SiO_2$), which are sometimes referred to as metallization layers, e.g., 204. Alternatively stated, each metallization layer 204 can include a number of metal lines and a number of metal vias embedded therein. Over the (e.g., frontside) surface of the first substrate 202, a plural number of such metallization layers 204 can be formed.

Further, on a topmost one of the metallization layers, the surface dielectric layer 206 is formed. In some embodiments, the surface dielectric layer 206, formed of one or more low-k dielectric materials, such as $SiO_2$, has a number of the first interconnect structures 210 disposed therein. The first interconnect structures 210 are formed using a damascene process, wherein a blanket dielectric material of the surface dielectric layer 206 is deposited over the workpiece (e.g., the topmost metallization layer), and the dielectric material is patterned using lithography. The patterned dielectric material is filled with a conductive material, and excess portions of the conductive material are removed from over the top surface of the dielectric material using a chemical mechanical polishing (CMP) process, an etch process, or combinations thereof. In other embodiments, a conductive material may be deposited and patterned using lithography, and a dielectric material of the surface dielectric layer 206 is formed over the conductive material to form the first interconnect structures 210 using a subtractive etch process. The excess dielectric material is then removed from over the first interconnect structures 210 using a CMP process, an etch process, or combinations thereof.

Corresponding to operation 120 of FIG. 1, FIGS. 3, 4, and 5 illustrate schematic diagrams of example chambers 300, 400, and 500 having one or more components being fluorinated, respectively, in accordance with various embodiments.

In various embodiments of the present disclosure, the chambers 300 to 500 are each configured to process the first semiconductor wafer 200 and one or more other semiconductor wafers for bonding purposes, and the component(s) of each of the chambers 300 to 500 have been fluorinated (e.g., being coated by a fluorinated layer), prior to loading the semiconductor wafers therein. For example, each of the chambers 300 to 500 can (later) induce a plasma, which may be utilized to remove contaminants from the bonding surface of the semiconductor wafer, in accordance with various embodiments.

Figure 3:
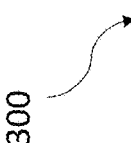
FIG. 3 shows a schematic diagram of a chamber, according to an embodiment.
Figure 4:
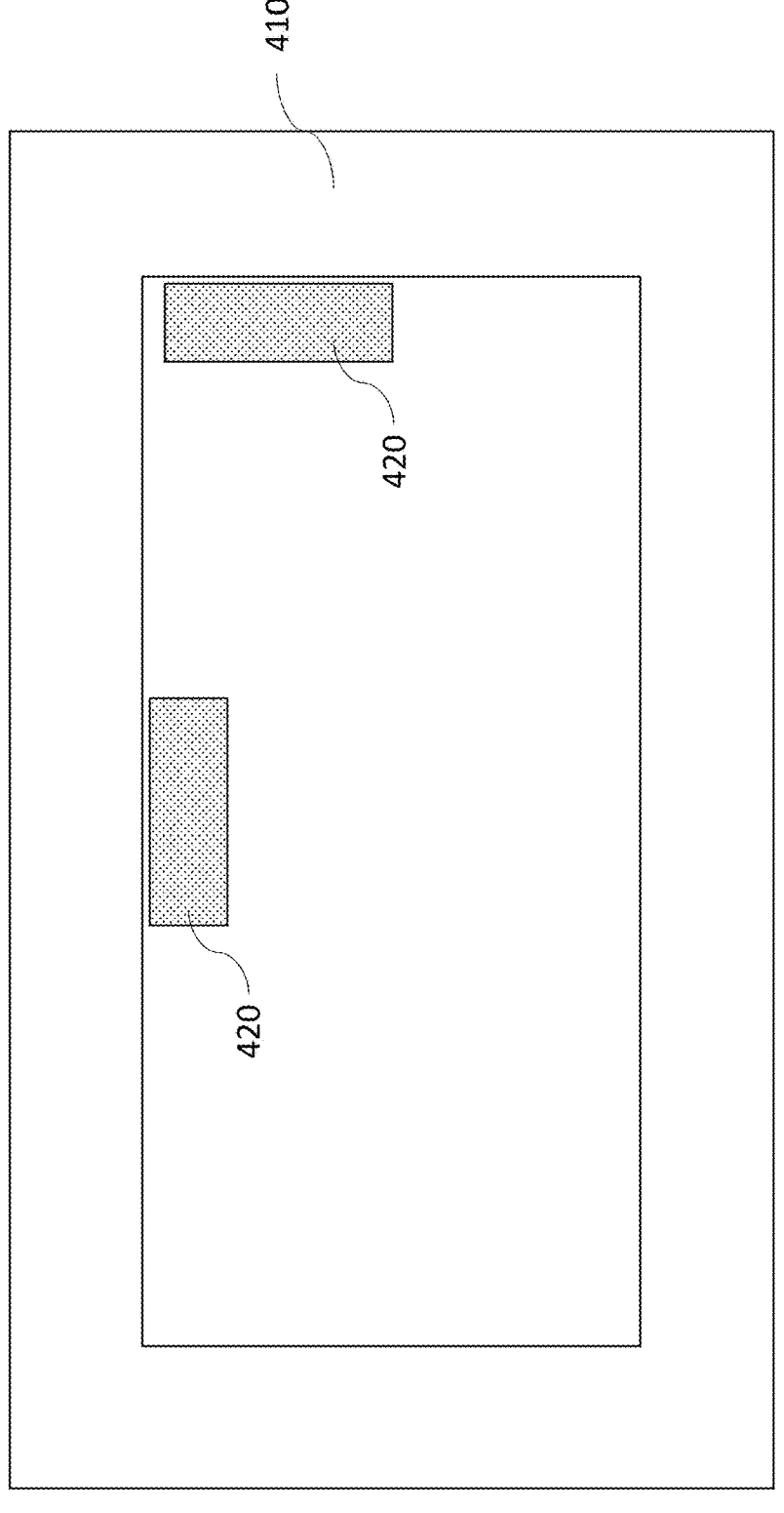
FIG. 4 shows a schematic diagram of a chamber, according to an embodiment.
Figure 5:
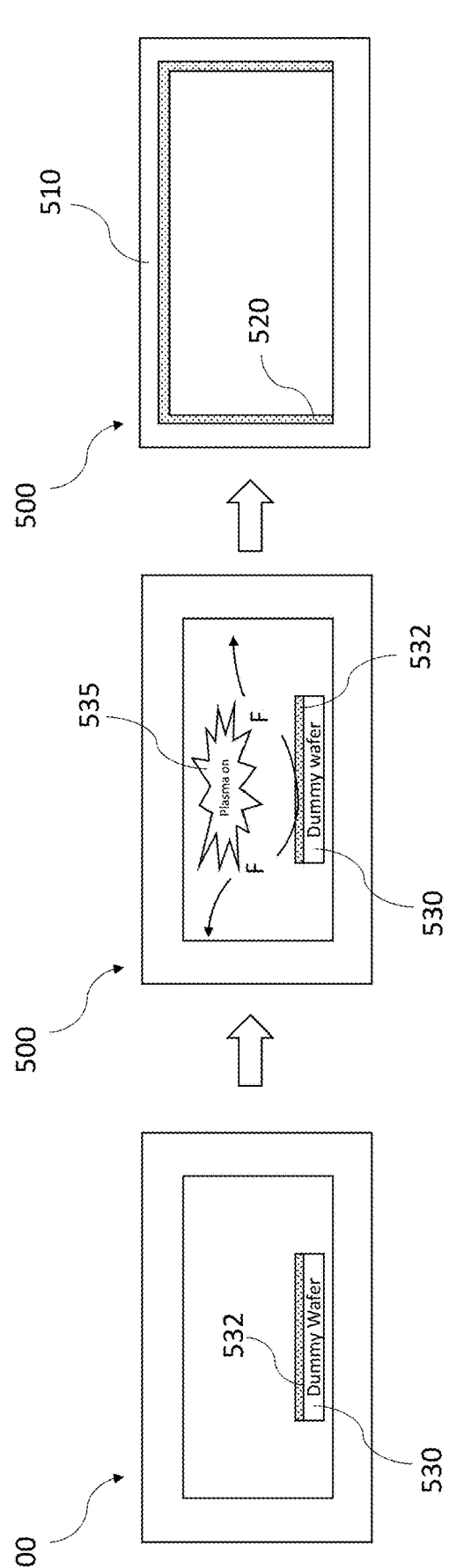
FIG. 5 shows a schematic diagram of a chamber, according to an embodiment.

It should be noted that the schematic diagrams of FIGS. 3-5 are simplified for illustrative purposes, and thus, each of the chambers 300 to 500 can include one or more other components, while remaining within the scope of the present disclosure. For example, the chambers 300 to 500 can each include one or more stages for positioning a wafer, one or more vacuum pumps, one or more shower heads, one or more electrodes, etc. In general, each of the chambers 300 to 500 includes walls that collectively house a semiconductor wafer. In some embodiments, inner surfaces of the walls have be partially or fully pre-fluorinated. In some embodiments, components that have been partially or fully pre-fluorinated can be selectively engaged onto (e.g., in contact with) the walls. As such, when a plasma is later induced in the chamber, fluorine in those pre-fluorinated components can be released and then redeposited on the bonding surface.

For example in FIG. 3, the chamber 300 includes walls 310. Inner surfaces of the walls 310 can be fully fluorinated by being fully covered by a fluorinated coating (e.g., a thin film) 320. As such, the fluorinated coating 320 may conform to the inner surfaces of the walls 310. In one embodiment, the fluorinated coating 320 has a thickness of below about 200 microns. In another embodiment, the fluorinated coating 320 has a thickness of below 50 microns. In yet another embodiment, the fluorinated coating 320 has a thickness of 5-20 microns. A thickness of the fluorinated coating 320, generally proportional to a percentage of fluorine contained in the fluorinated coating 320, can vary with different applications of the chamber 300. In some embodiments, the fluorinated coating 320 may be formed on the walls 310 using ion assisted deposition (IAD) or physical vapor deposition (PVD). In one embodiment, the fluorinated coating 320 is composed of $YF_3$. Alternatively or additionally, the fluorinated coating 320 may include trace amounts of other materials such as $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides.

For another example in FIG. 4, the chamber 400 includes walls 410. Inner surfaces of the walls 410 can be partially fluorinated by being attached with one or more fluorinated components 420. Such fluorinated components 420 can be selectively attached to one or more positions of the walls 410, e.g., replaceable or engageable. Each of the fluorinated components 420 can be fully or partially covered by a fluorinated coating (e.g., a thin film). In one embodiment, the fluorinated coating has a thickness of below about 200 microns. In another embodiment, the fluorinated coating has a thickness of below 50 microns. In yet another embodiment, the fluorinated coating has a thickness of 5-20 microns. A thickness of the fluorinated coating, generally proportional to a percentage of fluorine contained in the fluorinated coating, can vary with different applications of the chamber 400. In some embodiments, the fluorinated coating may be formed around outer surfaces of the component 420 using ion assisted deposition (IAD) or physical vapor deposition (PVD). In one embodiment, the fluorinated coating is composed of $YF_3$. Alternatively or additionally, the fluorinated coating may include trace amounts of other materials such as $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides.

For yet another example in FIG. 5, the chamber 500 includes walls 510. Inner surfaces of the walls 510 can be partially fluorinated by being partially covered by a fluorinated coating (e.g., a thin film) 520. In some embodiments, the fluorinated coating 520 may be formed on the walls 510 based on a fluorinated dummy wafer. For example, a dummy wafer 530 overlaid by a fluorinated thin film 532 is loaded into the chamber 500. The fluorinated thin film 532 is exposed to the inner surfaces of the walls 510. Next, a plasma 535 is induced in the chamber 500 so as to release fluorine (e.g., in the form of fluorine radicals) from the fluorinated thin film 532. Such released fluorine can then be redeposited over at least some of the inner surfaces of the walls 510 to form the fluorinated coating 520. In one embodiment, the fluorinated coating 520 has a thickness of below about 200 microns. In another embodiment, the fluorinated coating 520 has a thickness of below 50 microns. In yet another embodiment, the fluorinated coating 520 has a thickness of 5-20 microns. A thickness of the fluorinated coating 520, generally proportional to a percentage of fluorine contained in the fluorinated coating 520, can vary with different applications of the chamber 500. In one embodiment, the fluorinated coating 520 is composed of $YF_3$. Alternatively or additionally, the fluorinated coating 520 may include trace amounts of other materials such as $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides.

Corresponding to operation 130 and 140 of FIG. 1, FIGS. 6, 7, and 8 illustrate schematic diagrams of fluorine being released from the one or more components associated with the chambers 300, 400, and 500, respectively, and redeposited on the first semiconductor wafer 200 (FIG. 2), in accordance with various embodiments.

After fluorinating one or more components associated with the chamber, a to-be bonded semiconductor wafer (e.g., the first semiconductor wafer 200) can be loaded therein. Next, a fluorine-free plasma can be induced in the chamber, which can release fluorine (e.g., in the form of fluorine radicals) from the fluorinated components of the chamber. Such released fluorine can be redeposited on, doped into, or otherwise incorporated into a bonding surface of the to-be bonded semiconductor wafer. In one embodiment, the fluorine-free plasma may include a reactive ion etch mode (RIE) with only inert gasses such as nitrogen and argon in the chamber, which can clean metal surfaces and enhance the bonding energy at room temperature for both metal/metal and oxide/oxide bonds along the bonding surface. Additionally or alternatively, the fluorine-free plasma may include an oxygen plasma, which can further remove contamination from the surface of metals along the bonding surface.

Figure 6:
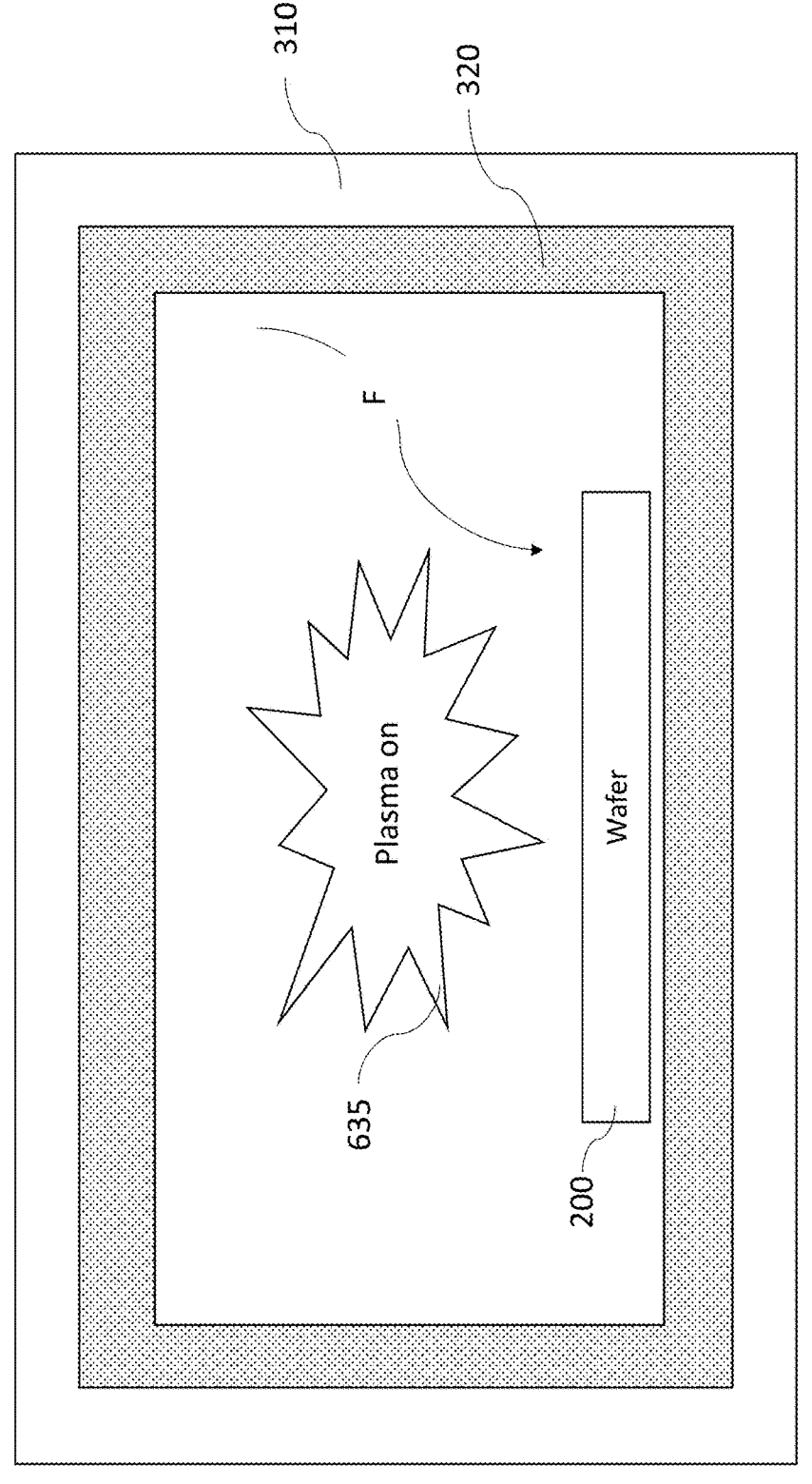
FIG. 6 shows a schematic diagram of fluorine being released from one or more components associated with a chamber, according to an embodiment.
Figure 7:
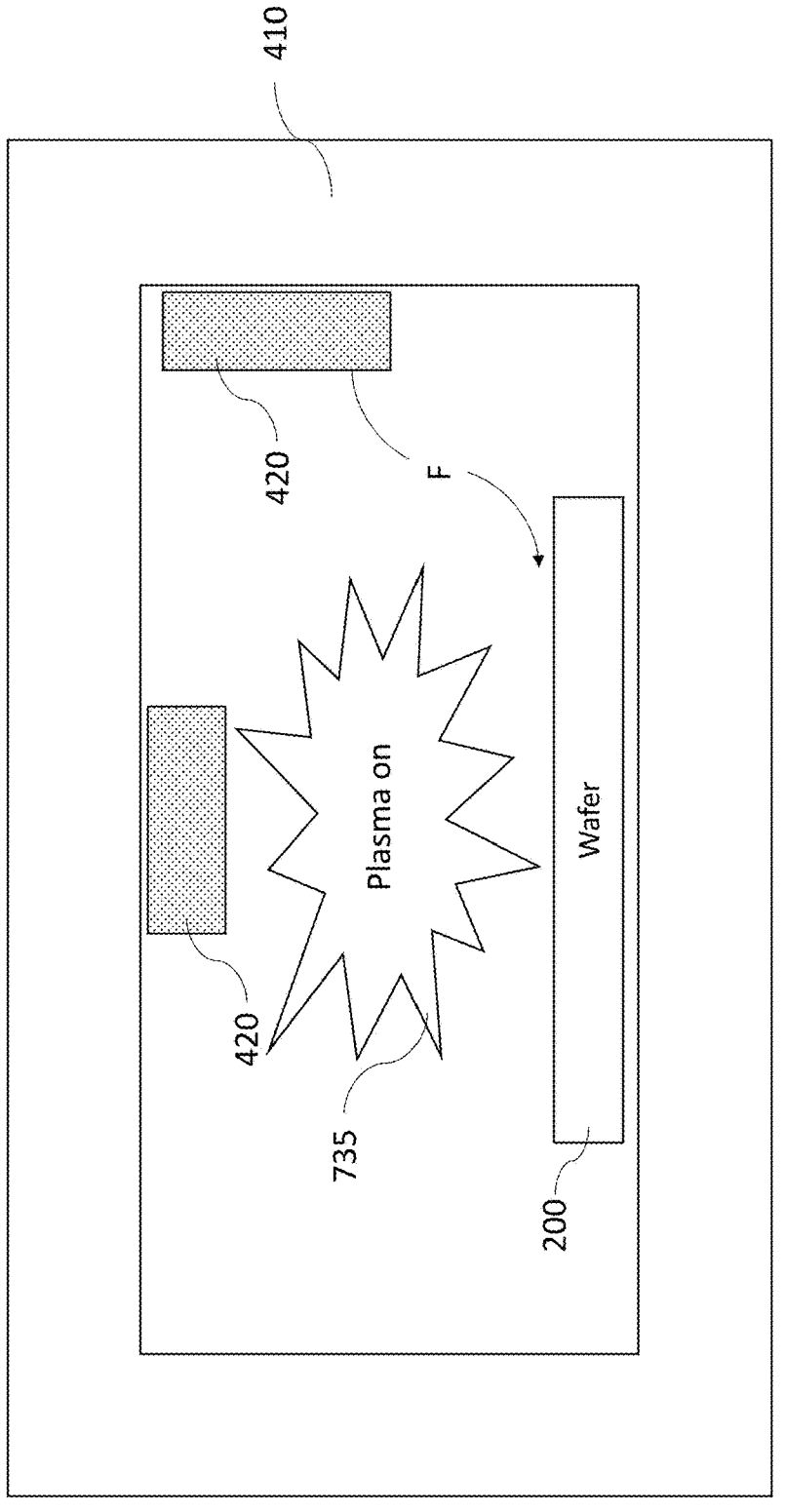
FIG. 7 shows a schematic diagram of fluorine being released from one or more components associated with a chamber, according to an embodiment.
Figure 8:
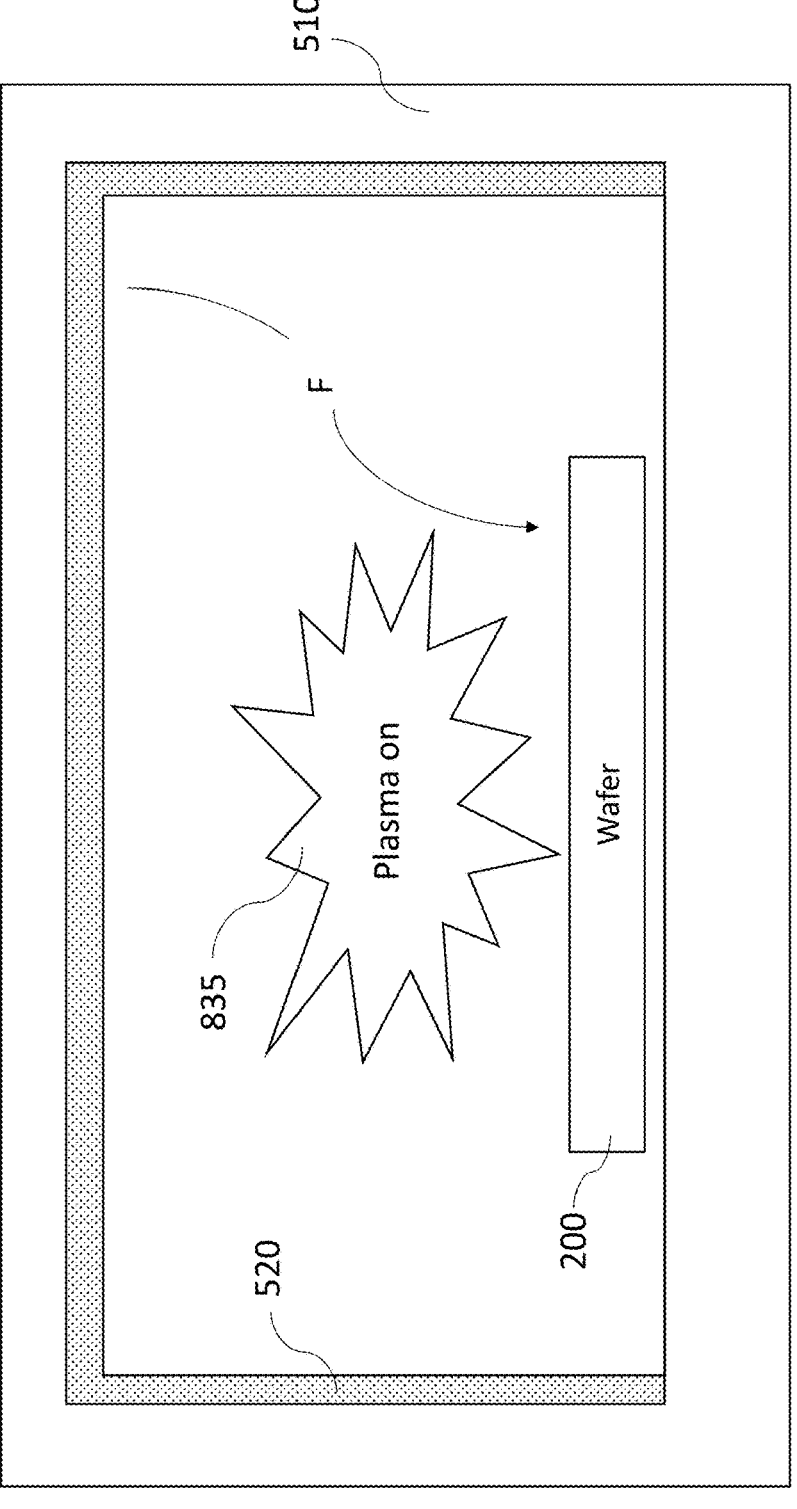
FIG. 8 shows a schematic diagram of fluorine being released from one or more components associated with a chamber, according to an embodiment.

For example in FIG. 6, a fluorine-free plasma 635 is induced in the chamber 300 so as to release the fluorine contained in or on the fluorinated coating 320, which can then be incorporated into the bonding surface of the semiconductor wafer 200. For another example in FIG. 7, a fluorine-free plasma 735 is induced in the chamber 400 so as to release the fluorine contained in or on the fluorinated components 420, which can then be incorporated into the bonding surface of the semiconductor wafer 200. For yet another example in FIG. 8, a fluorine-free plasma 835 is induced in the chamber 500 so as to release the fluorine contained in or on the fluorinated coating 520, which can then be incorporated into the bonding surface of the semiconductor wafer 200.

Following the similar operations 110 to 140 of the method 100, the bonding surface of a second semiconductor (not shown) can be treated with fluorine. The second semiconductor wafer can be substantially similar to the first semiconductor wafer, which also includes a bonding surface. The bonding surface includes both at least one dielectric material and at least one metal material. After being treated, the respective bonding surfaces of the first and second semiconductor wafers can be brought in contact with each other to be bonded to each other.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method for manufacturing semiconductor devices, comprising:
   fluorinating one or more components of a chamber by at least one of using ion assisted deposition (IAD) or physical vapor deposition (PVD), selectively attaching the one or more components comprising fluorine to one or more positions on one or more walls of the chamber, or applying a plasma that contains no fluorine to a dummy wafer in the chamber to provide a fluorinating coating to the one or more components;
   placing a semiconductor wafer in a chamber; and
   applying, in the chamber, a plasma that contains no fluorine,
   wherein the plasma causes one or more components, in contact with the chamber, that each comprise a fluorinated coating to release its fluorine on a surface of the semiconductor wafer.

2. The method of claim 1, wherein the one or more components provide a full coverage of the fluorinated coating of an inner surface of the chamber.

3. The method of claim 1, wherein the one or more components provide a partial coverage of the fluorinated coating of an inner surface of the chamber.

4. The method of claim 1, wherein the one or more components are engageable with respect to the chamber.

5. The method of claim 1, wherein the plasma includes one or more insert gases.

6. The method of claim 1, wherein the plasma includes oxygen.

7. The method of claim 1, wherein the one or more components are each fluorinated prior to placing the semiconductor wafer in the chamber.

8. The method of claim 1, further comprising:
   placing a second semiconductor wafer in the chamber;
   applying, in the chamber, the plasma to cause the one or more components to release its fluorine on a surface of the second semiconductor wafer; and
   bonding the semiconductor wafer to the second semiconductor wafer, with their respective surfaces facing each other.

9. The method of claim 8, wherein the surfaces of the semiconductor wafer and the second semiconductor wafer each include respective top surfaces of a metal material and a dielectric material.

10. The method of claim 1, prior to placing the semiconductor wafer in the chamber, further comprising:
   placing a dummy wafer in the chamber, wherein the dummy wafer includes a fluorinated coating; and
   applying, in the chamber, the plasma to cause the dummy wafer to release its fluorine on a surface the one or more components.

11. A method for fabricating semiconductor devices, comprising:
   placing a first semiconductor wafer in a chamber;
   applying, in the chamber, a plasma that contains no fluorine to cause one or more components, in contact with the chamber, that each comprise a fluorinated coating to release its fluorine on a first surface of the first semiconductor wafer;
   placing a second semiconductor wafer in the chamber; and
   applying, in the chamber, the plasma to cause the one or more components to again release its fluorine on a second surface of the second semiconductor wafer.

12. The method of claim 11, further comprising bonding the first semiconductor wafer to the second semiconductor wafer, with the first surface and the second surface facing each other.

13. The method of claim 11, wherein each of the first surface and the second surface includes respective top surfaces of a metal material and a dielectric material.

14. The method of claim 11, wherein the one or more components fully surround an inner surface of the chamber.

15. The method of claim 11, wherein the one or more components partially surround an inner surface of the chamber.

16. The method of claim 11, wherein the one or more components are engageable with respect to the chamber.

17. The method of claim 11, wherein the plasma includes one or more insert gasses.

18. The method of claim 11, wherein the plasma includes oxygen.

* * * * *